United States Patent
Kline et al.

(10) Patent No.: US 8,636,052 B2
(45) Date of Patent: Jan. 28, 2014

(54) DUAL-FLUID HEAT EXCHANGER

(75) Inventors: Eric Kline, Rochester, MN (US); Paul N. Krystek, Highland, NY (US); Paul R. Michels, Rochester, MN (US); Susan J. Swenson, Rochester, MN (US); Stephen M. Zins, Oronoco, MN (US)

(73) Assignee: International Business Machines Corporation, Armonk, NY (US)

( * ) Notice: Subject to any disclaimer, the term of this patent is extended or adjusted under 35 U.S.C. 154(b) by 1136 days.

(21) Appl. No.: 12/555,588

(22) Filed: Sep. 8, 2009

(65) Prior Publication Data

US 2011/0056655 A1   Mar. 10, 2011

(51) Int. Cl.
F28F 7/00 (2006.01)
H05K 7/20 (2006.01)

(52) U.S. Cl.
USPC ............ 165/80.2; 165/80.4; 165/104.29

(58) Field of Classification Search
USPC ........ 165/80.2, 80.4, 104.33, 104.28, 104.29, 165/10; 361/699, 700; 257/714, 715
See application file for complete search history.

(56) References Cited

U.S. PATENT DOCUMENTS

| | | | | |
|---|---|---|---|---|
| 2,996,894 A * | 8/1961 | Shade | | 62/59 |
| 3,406,244 A * | 10/1968 | Oktay | | 174/15.1 |
| 3,417,814 A * | 12/1968 | Oktay | | 165/104.13 |
| 3,570,156 A | 3/1971 | Walker | | |
| 3,626,080 A * | 12/1971 | Pierce | | 174/15.1 |
| 4,446,910 A * | 5/1984 | Miller et al. | | 165/10 |
| 4,466,478 A * | 8/1984 | Carlsson et al. | | 165/104.17 |
| 4,686,606 A | 8/1987 | Yamada et al. | | |
| 5,329,993 A | 7/1994 | Ettehadieh | | |
| 5,685,289 A * | 11/1997 | Yogev | | 126/400 |
| 6,687,124 B2 | 2/2004 | Ostby | | |
| 6,766,817 B2 | 7/2004 | da Silva | | |
| 6,918,404 B2 | 7/2005 | Dias da Silva | | |
| 7,066,586 B2 | 6/2006 | da Silva | | |
| 2002/0144804 A1 * | 10/2002 | Liang et al. | | 165/104.33 |
| 2004/0168447 A1 * | 9/2004 | Sugito et al. | | 62/114 |
| 2004/0237529 A1 | 12/2004 | da Silva | | |
| 2007/0227701 A1 * | 10/2007 | Bhatti et al. | | 165/104.21 |
| 2007/0295480 A1 * | 12/2007 | Campbell et al. | | 165/80.4 |
| 2009/0008063 A1 | 1/2009 | Salinas et al. | | |

FOREIGN PATENT DOCUMENTS

JP   5203201   8/1993

* cited by examiner

*Primary Examiner* — Tho V Duong
(74) *Attorney, Agent, or Firm* — Walter W. Duft

(57) ABSTRACT

An integrated circuit dual-fluid heat exchanger has a housing containing first and second immiscible fluids. A heat-introducing base element contacts the first fluid. A heat-receiving surface on the base element is configured for interfacial contact with a heat-radiating surface of an integrated circuit device. A heat-removing condenser element contacts the second fluid, or is separated therefrom by a gap. The first and second fluids are selected to controllably remove heat from the integrated circuit device by forming heated mass units of the first fluid that migrate through the second fluid and come into contact with the condenser element, where they are cooled and allowed to return to the base element. A heat-expulsion portion on the condenser element is configured to dissipate heat removed by the condenser element to an exterior environment outside the heat exchanger.

15 Claims, 2 Drawing Sheets

US 8,636,052 B2

DUAL-FLUID HEAT EXCHANGER

BACKGROUND

1. Field of the Invention

The present invention relates to electronic device cooling. More particularly, the invention pertains to the cooling of integrated circuit devices. These include computer memory, logic chips, and processor modules, and in addition, data processing systems, subsystems and other digital and analog electronic apparatus.

2. Description of the Prior Art

By way of background, heat exchange and the cooling of integrated circuit devices to ensure proper operation and prevent device failure has been and remains a significant technical challenge. Various cooling methods proposed to date have advanced the art. A technique that improves heat removal capacity and efficiency is disclosed herein.

SUMMARY

An integrated circuit dual-fluid heat exchanger has a housing containing first and second immiscible fluids. A heat-introducing base element contacts the first fluid. A heat-receiving surface on the base element is configured for interfacial contact with a heat-radiating surface of an integrated circuit device. A heat-removing condenser element contacts the second fluid, or is separated therefrom by a gap. The first and second fluids are selected to controllably remove heat from the integrated circuit device by forming heated mass units of the first fluid that migrate through the second fluid and come into contact with the condenser element, where they are cooled and allowed to return to the base element. A heat-expulsion portion on the condenser element is configured to dissipate heat removed by the condenser element to an exterior environment outside the heat exchanger.

BRIEF DESCRIPTION OF THE DRAWINGS

The foregoing and other features and advantages of the invention will be apparent from the following more particular description of disclosed embodiments, as illustrated in the accompanying Drawings, in which.

DETAILED DESCRIPTION OF EXAMPLE EMBODIMENTS

Figure 1:
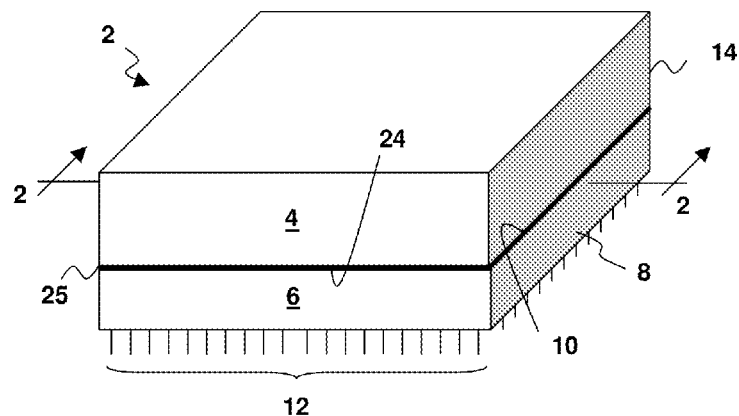
FIG. 1 is a perspective view showing a dual-fluid heat exchanger mounted on an integrated circuit device.

Turning now to the figures, which are not necessarily to scale, like reference numerals are used to represent like elements in all of the several views. FIG. 1 diagrammatically illustrates an assembly 2 that includes an integrated circuit dual-fluid heat exchanger 4 mounted to an integrated circuit device 6. The integrated circuit device 6 is conventional in nature and may be representative of any of a wide variety of electronic devices, including but not limited to computer memory, logic chips and processor modules. FIG. 1 illustrates a processor or logic chip configuration of the integrated circuit device 6. However, this is for purposes of illustration only. The integrated circuit device 6 could have many other configurations commonly associated with computer memory, logic chips and processor modules. Moreover, in addition to memory, chips and modules, the integrated circuit device 6 could be also be embodied in a data processing system, subsystem or other digital or analog electronic apparatus.

In FIG. 1, the integrated circuit device 6 is shown as having a device housing 8 that includes an upper heat-radiating surface 10 made from a suitable heat-conducting material. The device housing 8 is shown as being generally rectangular and the heat-radiating surface 10 is shown as being generally planar. However, the housing 8 need not be generally rectangular and the heat-radiating surface 10 need not be generally planar. The heat-radiating surface 10 may be relatively smooth, or it could be textured or otherwise configured to increase its heat-radiating surface area. As its name implies, the heat-radiating surface 10 serves to radiate heat generated by integrated circuit components (not shown) within the device housing 8 during device operation. A set of electrical connectors (e.g., pins) 12 extends from the bottom of the housing 8 for connection to an electrical circuit board or other electrical circuit interface, such as a socket or a chip carrier. For ease of description, neither the circuit board nor other electrical circuit interface components are illustrated in the drawings. It should be understood that the orientation of the device housing 8 in FIG. 1 is for purposes of illustration only, and that other orientations could be used. For example, the integrated circuit device 6 could be inverted such that the heat-radiating surface 10 is at the bottom of the housing 8 and the electrical connectors 12 are be at the top of the housing. In this configuration, the heat exchanger 4 would be placed below the housing 8.

Figure 2:
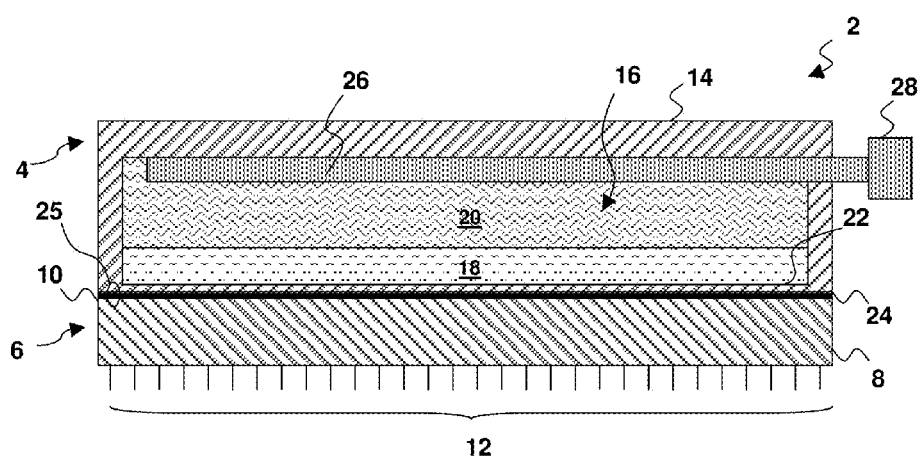
FIG. 2 is a cross-sectional view taken along line 2-2 in FIG. 1 showing the heat exchanger constructed according to a first example embodiment prior to operation of the integrated circuit device.
Figure 3:
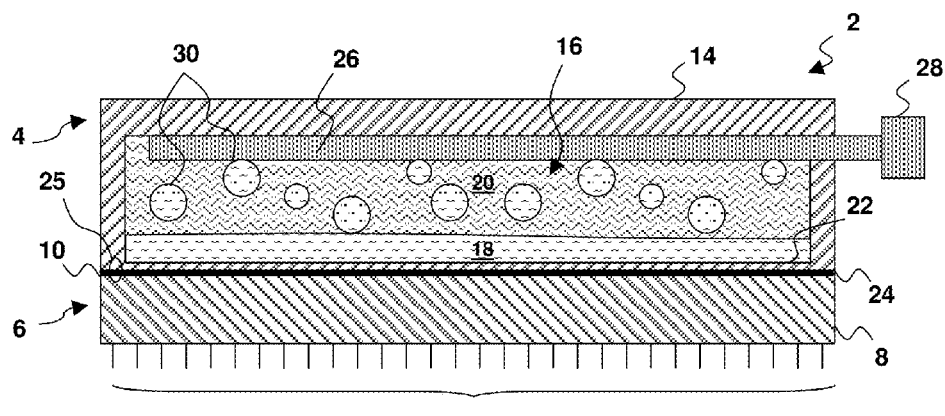
FIG. 3 is a cross-sectional view taken along line 2-2 in FIG. 1 showing the heat exchanger of FIG. 2 during operation of the integrated circuit device.

With additional reference now to FIGS. 2 and 3, the heat exchanger 4 has a housing 14 that defines a fluid chamber 16 for containing first and second immiscible fluids 18 and 20. The bottom of the housing 14 may be provided with a heat-introducing base element 22 that contacts the first fluid 18. The base element 22 can be made from any suitable heat-conducting material. A heat-receiving surface 24 at the bottom of the base element 22 is configured for interfacial contact with the heat-radiating surface 10 of the integrated circuit device 6. An interconnection system 25 may be provided for maintaining the heat-receiving surface 24 of the base element 22 in the desired interfacial contact relationship with the heat-radiating surface 10 of the integrated circuit device 6. For example, the heat-receiving surface 24 may be bonded to the heat-radiating surface 10, such as by using a heat-conducting adhesive paste or other material disposed between the heat-receiving surface 24 and the heat-radiating surface 10 that provides the interconnection system 25. Mechanical fastener arrangements could also be used, either alone or in conjunction with an adhesive.

The heat exchanger 4 further includes a heat-removing condenser element 26 that contacts the second fluid 20. A heat-expulsion portion 28 on the condenser element 26 is configured to dissipate heat removed by the condenser element to an exterior environment outside the heat exchanger 4. The condenser element 26 may be implemented using a variety of constructions, including as a solid mass of heat conductive material. It may also have a non-solid construction with one or more interior passages (not shown) that carry an additional heat transfer material, such as a gas or a liquid. The heat-expulsion portion 28 may have any suitable configuration (such as heat radiating fins), and may be operatively associated with additional heat-expelling components, such as a fan. It may also comprise a radiator system or the like (e.g., for cooling a heat transfer material carried within a fluid carrying implementation of the condenser element 26). In general, any structural feature of the condenser element 26 that allows it to transfer the heat removed from the fluid chamber 16 may be considered to be the heat-expulsion portion 28.

One of the first and second fluids 18 and 20 may be relatively hydrophobic (non-polar) and the other of the first and second fluids may be relatively hydrophilic (polar). For example, the first fluid 18 could be a strongly hydrophilic fluid, such as an aqueous composition, and the second fluid 20 could be a strongly hydrophobic fluid, such as an oil-based composition. As shown in FIG. 2, because the first and second fluids 18 and 20 are immiscible, they will tend to separate from each other when the integrated circuit device 6 is not operating and generating no heat. This separation is due to the inherent wetting energy gap between the two fluids and also as a result of differences in the respective fluid densities. The wetting energy gap is the surface free energy that exists between two immiscible fluids, such as oil and water. This energy barrier is produced by interfacial tension between the two fluids that prevents one liquid from becoming emulsified in the other absent the introduction of external mechanical and/or heat energy.

Interfacial tension represents the tensile force per unit length of fluid interface. This tensile force acts in a direction that tends to reduce the size of the interface. Relatedly, the surface free energy or wetting energy gap at the fluid interface is the work in opposition to the interfacial tension that is required to form a unit of new interface area. The wetting energy gap is temperature dependent. Thus, when the integrated circuit device 6 is not operating (and therefore producing no heat), the wetting energy of the first and second fluids 18 and 20 will be higher than it is when the device is operating. This means that in the steady (non-operational) state, the fluids will tend to maintain an interfacial surface area that is as small as possible. Relatedly, the radius of curvature ($R_c$) of the fluid masses will be relatively high, thereby providing a relatively linear interface. This steady state condition is shown in FIG. 2, wherein the first fluid 18 is completely separated from the second fluid 20. FIG. 2 also illustrates that the first fluid 18 is more dense than the second fluid 20 in the steady state, such that the first fluid lies below the second fluid within the fluid chamber 16 when the fluids are at ambient temperature.

Thereafter, as heat energy is received from the integrated circuit device 6, the interfacial tension at the interface of the first and second fluids 18 and 20 is lowered and a larger interfacial surface area becomes possible. This allows the first fluid 18 to emulsify in the second fluid 20, causing the first fluid 18 to form heated mass units 30 of reduced $R_c$ size, as shown in FIG. 3. The mass units 30 controllably remove heat from the integrated circuit device 6 due to the energy required for their formation, and due to the mass units migrating through the second fluid to the condenser element 26, where they are cooled and allowed to return to the base element 22. It will be appreciated that the heat-driven formation of low $R_c$ mass units 30 represents an independent energy transfer mechanism that is separate from thermal convection or mass flow. Factors that will influence overall heat transfer include the size and number of the heat-carrying mass units 30, the rate at which the mass units leave the base element 22, the rate at which the mass units migrate across the second fluid 20 to the condenser element 26, and the rate at which the mass units return from the condenser element to the base element in order to be reheated.

The first and second fluids 18 and 20 may be selected according to these and other factors. It will be appreciated that the selection of the first and second fluids 18 and 20 may encompass not only the materials that provide the base hydrophilic and hydrophobic compositions, but also the optional use of additives in one or both of the fluids 18 and 20, such as surfactants and other agents, in order to influence the material properties. The fluid selection process may be performed empirically based on routine experiment and/or using known mathematical relationships involving fluid interfaces and heat transfer by fluids (and gases).

By way of example only, and not by way of limitation, materials that may be used as the first and second fluids 18 and 20 are listed in Table 1 below. Note that the first and second fluids are not necessarily paired with each other. Many permutations would be possible based on the first and second fluid wetting energy gap, specific gravities (i.e., densities), volumetric thermal expansion, boiling points and vapor pressures.

TABLE 1

| FIRST FLUID 18 | SECOND FLUID 20 |
| --- | --- |
| Water | Paraffin or ozokerite wax |
| Water plus a glycol (e.g., ethylene, polyethylene or propylene glycol) | Paraffin or ozokerite wax plus mineral oil |
| Glacial acetic acid | Beeswax, castor wax, Montan wax, Carnauba wax, or microcrystalline wax |
| Formic acid, methanol, ethanol, a propynol, or a butanol | Mineral oil, naphthenic oil or cycloalkanes |
| Acetonitrile or tetrahydrofuran | Chloroform |

For example, the first and second fluids 18 and 20 may be selected based on consideration of a target wetting energy gap that should exist when the heat exchanger is non-operational (e.g., when it is at room temperature). The initial wetting energy gap should be a value that will be sufficiently reduced by the heat introduced from the integrated circuit device 6 during operation of heat exchanger 4 to create the desired emulsion characteristics. Generally speaking, it would be expected that a lower initial wetting energy gap requires less energy for emulsification whereas a higher initial wetting energy gap requires more energy.

The first fluid 18 and the second fluid 20 may also be selected to allow the first fluid to emulsify within a desired mass unit $R_c$ size range in the second fluid in order to provide a desired amount of heat removal per mass unit 30. Generally speaking, it would be expected that mass units 30 of larger size will transfer more heat than mass units of smaller size. However, it would also be expected that a large number of small mass units 30 may transfer more heat than a small number of large mass units.

As indicated above, the heat removal capacity of the heat exchanger 4 will also be influenced by the rate at which the mass units 30 leave the base element 22. This property may be influenced by the degree to which the first fluid 18 wets the base element 22, which requires consideration of both the first fluid and the base element material. Generally speaking, it would be expected that a first fluid 18 which cannot easily wet the base element 22 would be more easily separated than if the wetting is greater. On the other hand, it would also be expected that a highly wetted interface would transfer heat more efficiently from the base element 22 to the first fluid 18.

The heat removal capacity of the heat exchanger 4 will also be influenced by the rate at which the mass units 30 of the first fluid 18 migrate through the second fluid 20 to the condenser 26. The rate of migration toward the condenser 26 will be dependent on the relative coefficients of thermal expansion of the first and second fluids 18 and 20. In the configuration of FIGS. 1-3 wherein the condenser 26 is above the base element 22, the first fluid 18 will have a larger coefficient of thermal expansion than that of the second fluid 20. In this way, the first fluid 18 will become more buoyant in the second fluid 20 as its specific gravity decreases relative to that of the second fluid. By selecting the respective coefficients of thermal expansion of the first and second fluids 18 and 20, the mass units 30 of the first fluid will migrate at a desired rate through the second fluid in order to provide a desired amount of mass flow heat removal from the integrated circuit device during operation of said heat exchanger. As mentioned above, a variation of the assembly 2 of FIGS. 1-3 could be constructed wherein the assembly is inverted. In that case, it will be appreciated that a different fluid selection will be required because the first fluid 18 would need to descend through the second fluid 20 when it is heated.

An additional factor in the heat removal capacity of the heat exchanger 4 is the rate at which the mass units return to the base element 22 after being cooled by the condenser. Generally speaking, it would be expected that the return migration of the first fluid 18 through the second fluid 20 will be affected by the wetting energy gap between the fluids. As the mass units 30 of the first fluid 20 give up heat to the condenser 26 and begin to cool, the mass units will tend to agglomerate as the wetting energy gap between the fluids increases. This increase in wetting energy allows the second fluid 20 to act as a mechanical wick that draws the agglomerated first fluid mass units toward the base element 22 due to the increasing interfacial tension that forces the interfacial surface area to shrink. The first and second fluids 18 and 20 may be selected to allow the second fluid to wick the first fluid toward the base element at a desired rate as the first fluid cools due to contact with the condenser element 26. The densification of the first fluid 18 as it cools further assists the return migration of the first fluid 18.

It should be noted that the heat exchanger 4 embodied in FIGS. 2 and 3 is designed with the first fluid being selected to remain in a liquid state during heat exchanger operation. Pursuant to this liquid-liquid embodiment, the second fluid 20 fills the fluid chamber 16 so that it is in contact with the condenser element. In this way, the first fluid 18 can move freely through the second fluid 20 from the base element 22 to the condenser 26.

Figure 4:
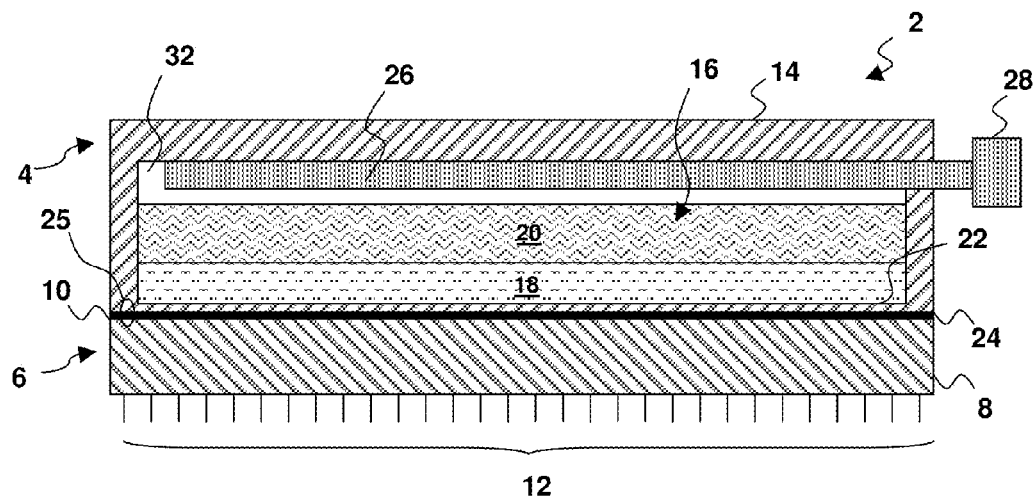
FIG. 4 is a cross-sectional view taken along line 2-2 in FIG. 1 showing the heat exchanger constructed according to a second example embodiment prior to operation of the integrated circuit device.
Figure 5:
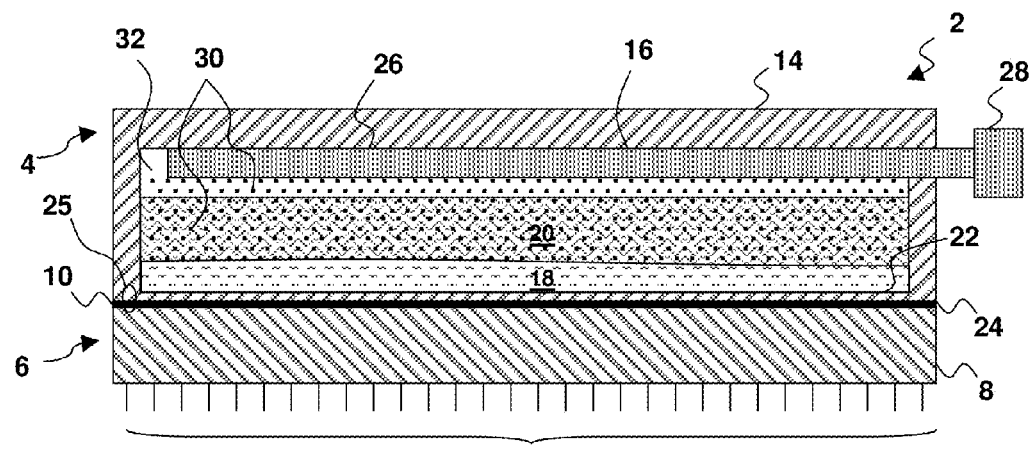
FIG. 5 is a cross-sectional view taken along line 2-2 in FIG. 1 showing the heat exchanger of FIG. 4 during operation of the integrated circuit device.

Turning now to FIGS. 4 and 5, an alternative liquid-vapor embodiment of the heat exchanger 4 is shown in which the first fluid 18 is selected to change to a vapor state during operation of the heat exchanger 4. In other words, the first fluid 18 boils at the operational temperature of the integrated circuit device 6. Pursuant to this design, the second fluid 20 may be separated from the condenser element 26 by a vapor space gap 32 (e.g., an air gap) that accommodates expansion of the first fluid. The heated mass units 30 in this embodiment comprise first fluid vapor that migrates through the second fluid to the condenser 26, where it condenses back to liquid form, drops into the second fluid 20, and returns to the base element 22 by way of the above-described wetting energy gap wicking mechanism. Applicants consider this dual-fluid wicking mechanism to be more efficient than the mechanical wicks used in prior art single-fluid phase-change heat exchangers, such as devices that implement wick-lined heat pipes. In such heat exchangers a liquid is vaporized by a heat source (thereby removing heat from the heat source) and the heated vapor travels through an air medium to a condenser. The aforementioned mechanical wicks are used to assist in the return of the condensed vapor back to the fluid source. This is a capillary action mechanism involving a fluid (the condensed vapor) and a solid (the wick material). In contrast, the embodiment shown in FIGS. 4 and 5 herein uses a more efficient liquid-liquid wicking mechanism driven by the inherent wetting energy gap between the fluids that increases as the first fluid 18 cools.

It may be demonstrated that the prior art single fluid, phase-change heat exchangers are also less efficient (by a wide margin) than the liquid-liquid embodiment of the heat exchanger 4 shown in FIGS. 2 and 3. By way of explanation, consider that the rate of heat conduction (H) between the heat radiating surface 10 and the condenser element 26 is given below in equation (1):

$$H = dQ/dt = -kA\,\Delta T/x, \quad (1) \text{ where}$$

H=rate of heat conduction
dQ=incremental heat transfer
dt=incremental change in time
k=thermal conductivity
A=area of the fluid chamber 16 normal to the direction of heat flow
$\Delta T$=temperature differential between condenser element 26 and heat radiating surface 10
x=distance between the condenser element 26 and the heat radiating surface 10.

In comparing the liquid-liquid embodiment disclosed herein with the prior art single fluid, phase-change technique, it will be seen from the right-hand side of equation (1) that the thermal conductivity "k" determines the difference in heat conduction performance "H" assuming the same heat exchanger structure is used and the quantities "A," "$\Delta T$" and "x" are thus the same. The thermal conductivity "k" for different materials having the properties of an ideal gas may be determined from the relationship of equation (2) given below:

$$k = nv\lambda c_v/3N_A, \quad (2) \text{ where}$$

n=particles per unit volume
v=mean particle speed
$\lambda$=mean-free particle path
$c_v$=molar heat capacity
$N_A$=Avogadro's number
This equation provides that the thermal conductivity k is proportional to the average molecular velocity, the mean free path, and the molar heat capacity of the gas.

Assume that k1=thermal conductivity of a vaporized heat transfer fluid using the prior art single fluid, phase-change technique. Assume further that k2=thermal conductivity of mass units of the first fluid 18 as it migrates through the second fluid 20 in the disclosed liquid-liquid embodiment of FIGS. 2 and 3. The net gain in thermal conductivity provided by the liquid-liquid embodiment relative to the prior art single-fluid, phase-change technique may then be determined based on the following assumptions:
Assumption (1)—$c_v$ and $N_A$ are the same for both k1 and k2;
Rationale for assumption (1): It is self-evident that the molar heat capacity and Avogadro's number for mass units of the first fluid 18 migrating through the second fluid 20 in accordance with the disclosed liquid-liquid embodiment will be the same as the molar heat capacity and Avogadro's number if the same fluid is used in the prior art single-fluid, phase-change technique under the same temperature conditions;

Assumption (2)—$\lambda 2=1$ cm, $\lambda 1=68$ nm, and $\lambda 2/\lambda 1=14705882$;

Rationale for assumption (2): the mean-free particle path is the distance that a particle of the heat-carrying fluid will travel before impacting another particle of the same material. The value of 68 nm used for $\lambda 1$ is the estimated distance between collisions for an ideal gas at atmospheric pressure. The value of 1 cm used for $\lambda 2$ is the estimated distance for collisions between mass units of the first fluid 18 in the disclosed liquid-liquid embodiment, which will be spaced further apart within the second fluid 20 than the gas particles of the prior art single-fluid, phase-change technique;

Assumption (3)—$n2=0.001*n1$, $n1=N_A$, and $n2/n1=0.001$;

Rationale for assumption (2): The number of mass units per unit volume occupied by the first fluid 18 in the disclosed liquid-liquid embodiment is estimated to be 0.001 times the number of particles per unit volume of the vaporized fluid used in the prior art single-fluid phase-change technique;

Assumption (4)—$v2=0.01*v1$, $v1=600$ m/s, and $v2/v1=0.01$;

Rationale for assumption (4): The mean particle speed of mass units of the first fluid 18 in the disclosed liquid-liquid embodiment is estimated to be 0.01 the mean particle speed of particles of the vaporized fluid used in the prior art single-fluid phase-change technique. Based on the foregoing assumptions, the net conductivity gain "knet" may be represented by equation (3) given below:

$$knet = k2/k1 = (n2/n1)(v2/v1)(\lambda 2/\lambda 1)$$
$$= 0.001*0.01*14705882 = 147.$$

Thus, it may be concluded that the liquid-liquid embodiment disclosed herein yields approximately 150 times more heat conductivity than the single-fluid, phase-change vaporization technique of the prior art.

Accordingly, a dual fluid heat exchange system has been disclosed. The heat exchanger may be implemented according to a method in which it is mounted it to an integrated circuit device, and operated to draw heat from the device to cause heated mass units of the first fluid to migrate through the second fluid to a condenser element, where the heat is removed from the mass units and expelled from a heat-expulsion portion of the condenser element. In this way, the integrated circuit device may be cooled using a wetting energy gap mechanism in conjunction with the differential thermal expansion properties of the two fluids. Although various embodiments of the invention have been described, it should be apparent that many variations and alternative embodiments could be implemented in accordance with the invention. It is understood, therefore, that the invention is not to be in any way limited except in accordance with the spirit of the appended claims and their equivalents.

What is claimed is:

1. An integrated circuit dual-fluid heat exchanger, comprising:
    a housing;
    a first fluid in said housing;
    a second fluid in said housing;
    said first fluid being immiscible with said second fluid;
    a heat-introducing base element in contact with said first fluid;
    a heat-receiving surface on said base element, said heat-receiving surface being configured for interfacial contact with a heat-radiating surface of an integrated circuit device;
    a heat-removing condenser element in contact with said second fluid or separated therefrom by a gap;
    said first and second fluids being selected to controllably remove heat from said integrated circuit device by forming heated mass units of said first fluid that migrate through said second fluid to the condenser element, where they are cooled and allowed to return to the base element; and
    a heat-expulsion portion on said condenser element, said heat-expulsion portion being configured to dissipate heat removed by said condenser element to an exterior environment outside of said heat exchanger;
    wherein all of said first fluid is selected to remain in a liquid state during operation of said heat exchanger and said second fluid is in contact with said condenser element.

2. The heat exchanger of claim 1, wherein said one of said first and second fluids is relatively hydrophobic and the other of said first and second fluids is relatively hydrophilic to provide a selected wetting energy gap.

3. The heat exchanger of claim 1, wherein said first fluid and said second fluid are selected to allow said first fluid to emulsify within a desired mass unit size range while it migrates in a liquid state through said second fluid to said condenser element in order to provide a desired amount of heat removal from said integrated circuit device during operation of said heat exchanger.

4. The heat exchanger of claim 3, wherein said first fluid has a different coefficient of thermal expansion than said second fluid so that said first fluid becomes more or less buoyant in said second fluid as its specific gravity changes relative to that of said second fluid and said mass units migrate at a desired rate through said second fluid in order to provide a desired amount of heat removal from said integrated circuit device during operation of said heat exchanger.

5. The heat exchanger of claim 1, wherein said first and second fluid are selected to allow said second fluid to wick said first fluid toward said base element at a desired rate as said first fluid cools due to contact with said condenser element in order to provide a desired amount of heat removal from said integrated circuit device during operation of said heat exchanger.

6. A method for cooling an integrated circuit device, comprising:
    mounting a dual-fluid heat exchanger on said integrated circuit device, said heat exchanger comprising:
        a housing;
        a first fluid in said housing;
        a second fluid in said housing;
        said first fluid being immiscible with said second fluid;
        a heat-introducing base element in contact with said first fluid;
        a heat-receiving surface on said base element, said heat-receiving surface being configured for interfacial contact with a heat-radiating surface of said integrated circuit device;
        a heat-removing condenser element in contact with said second fluid or separated therefrom by a gap;
        said first and second fluids being selected to controllably remove heat from said integrated circuit device by forming heated mass units of said first fluid that migrate through said second fluid to the condenser element, where they are cooled and allowed to return to the base element; and
        a heat-expulsion portion on said condenser element, said heat-expulsion portion being configured to dissipate heat removed by said condenser element to an exterior environment outside of said heat exchanger;
    operating said integrated circuit device to generate heat; and
    removing heat from said heat-expulsion portion of said condenser element;

wherein all of said first fluid is selected to remain in a liquid state during operation of said heat exchanger and said second fluid is in contact with said condenser element.

7. The method of claim 6, wherein said one of said first and second fluids is relatively hydrophobic and the other of said first and second fluids is relatively hydrophilic to provide a selected wetting energy gap.

8. The method of claim 6, wherein said first fluid and said second fluid are selected to allow said first fluid to emulsify within a desired mass unit size range while it migrates in a liquid state through said second fluid to said condenser element in order to provide a desired amount of heat removal from said integrated circuit device during operation of said heat exchanger.

9. The method of claim 8, wherein said first fluid has a different coefficient of thermal expansion than said second fluid so that said first fluid becomes more or less buoyant in said second fluid as its specific gravity changes relative to that of said second fluid and said mass units migrate at a desired rate through said second fluid in order to provide a desired amount of heat removal from said integrated circuit device during operation of said heat exchanger.

10. The method of claim 6, wherein said first and second fluid are selected to allow said second fluid to wick said first fluid toward said base element at a desired rate as said first fluid cools due to contact with said condenser element in order to provide a desired amount of heat removal from said integrated circuit device during operation of said heat exchanger.

11. An integrated circuit device in combination with a dual-fluid heat exchanger, comprising:
   an integrated circuit device having a heat-radiating surface;
   a dual-fluid heat exchanger mounted on said integrated circuit device, said heat exchanger comprising:
      a housing;
      a first fluid in said housing;
      a second fluid in said housing;
      said first fluid being immiscible with said second fluid;
      a heat-introducing base element in contact with said first fluid;
      a heat-receiving surface on said base element, said heat-receiving surface being configured for interfacial contact with said heat-radiating surface of said integrated circuit device;
      a heat-removing condenser element in contact with said second fluid or separated therefrom by a gap;
      said first and second fluids being selected to controllably remove heat from said integrated circuit device by forming heated mass units of said first fluid that migrate through said second fluid to the condenser element, where they are cooled and allowed to return to the base element; and
      a heat-expulsion portion on said condenser element, said heat-expulsion portion being configured to dissipate heat removed by said condenser element to an exterior environment outside of said heat exchanger;
      wherein said heat exchanger is selected for a liquid-liquid mode of operation wherein all of said first fluid is selected to remain in a liquid state during operation of said heat exchanger and said second fluid is in contact with said condenser element.

12. The combination of claim 11, wherein said one of said first and second fluids is relatively hydrophobic and the other of said first and second fluids is relatively hydrophilic to provide a selected wetting energy gap.

13. The combination of claim 11, wherein said first fluid and said second fluid are selected to allow said first fluid to emulsify within a desired mass unit size range while it migrates in a liquid state through said second fluid to said condenser element in order to provide a desired amount of heat removal from said integrated circuit device during operation of said heat exchanger.

14. The combination of claim 13, wherein said first fluid has a different coefficient of thermal expansion than said second fluid so that said first fluid becomes more or less buoyant in said second fluid as its specific gravity changes relative to that of said second fluid and said mass units migrate at a desired rate through said second fluid in order to provide a desired amount of heat removal from said integrated circuit device during operation of said heat exchanger.

15. The combination of claim 11, wherein said first and second fluid are selected to allow said second fluid to wick said first fluid toward said base element at a desired rate as said first fluid cools due to contact with said condenser element in order to provide a desired amount of heat removal from said integrated circuit device during operation of said heat exchanger.

\* \* \* \* \*